United States Patent

Remise et al.

[11] Patent Number: 5,101,321
[45] Date of Patent: Mar. 31, 1992

[54] MODULE FOR MUFFLING A FAN AND FOR FIXATION TO AN ELECTRONIC MACHINE CHASSIS

[76] Inventors: Rene Remise; Gilles Jardet, both of Bull, S.A. 121 avenue de Malakoff, 75116 Paris, France

[21] Appl. No.: 592,475

[22] Filed: Oct. 5, 1990

[30] Foreign Application Priority Data

Oct. 5, 1989 [FR] France ............................. 89 13036

[51] Int. Cl.⁵ .............................................. H05K 7/20
[52] U.S. Cl. .................................. 361/384; 165/122; 220/4.02; 454/184
[58] Field of Search ............... 165/104.33, 104.34, 165/80.3, 122; 310/68 D; 363/141; 98/1; 174/15.1, 16.1, 379; 361/382, 383, 384; 220/4.02, 913

[56] References Cited

U.S. PATENT DOCUMENTS

| | | | |
|---|---|---|---|
| 3,967,874 | 7/1976 | Calabro | 361/384 |
| 4,327,398 | 4/1982 | Christison | 361/384 |
| 4,383,286 | 5/1983 | Hicks | 361/384 |
| 4,517,880 | 5/1985 | Buckner et al. | 454/184 |
| 4,744,005 | 5/1988 | Milani | 361/384 |
| 4,767,262 | 8/1988 | Simon | 415/119 |
| 4,794,487 | 12/1988 | Maschek | 361/383 |
| 4,926,291 | 5/1990 | Sarraf | 361/384 |

FOREIGN PATENT DOCUMENTS

| | | |
|---|---|---|
| 0135845 | 2/1986 | European Pat. Off. |
| 3408139 | 9/1985 | Fed. Rep. of Germany |
| 8707975.5 | 11/1988 | Fed. Rep. of Germany |

OTHER PUBLICATIONS

Snap-Together Cooling Fan Assembly, Kekas et al., IBM Tech. Discl. Bull., vol. 22, No. 6, Nov. 79, p. 2391.

*Primary Examiner*—Gerald P. Tolin

[57] ABSTRACT

A module for fixation and muffling of a fan for the chassis of an electronic machine is characterized in that it includes a suport housing (1) in the form of a cube with cut-off corners, provided with air circulation openings on its upper (15) and lower (10) faces. The upper face includes means (150, 151, 152) for interlocking with the chassis (91) of the machine, and the cut-off corners include openings (16, 17, 18, 19) enabling the introduction of the corners of a unit formed by a fan housing (3) surrounded on its periphery by a block of foam (4).

15 Claims, 3 Drawing Sheets

MODULE FOR MUFFLING A FAN AND FOR FIXATION TO AN ELECTRONIC MACHINE CHASSIS

FIELD OF THE INVENTION

The present invention relates to a fan fixation and muffling module for the chassis of an electronic machine.

BACKGROUND OF THE INVENTION

The fan meant for cooling the electronic components placed in the chassis of a machine is most often affixed to the chassis by detachable means, such as screws, and its installation requires relatively time-consuming assembly and manipulation, all of which is expensive in the final analysis. Moreover, when a fan is intended to operate a silently as possible, fixation means that tend to abate noise must be used. This is usually an elastic block mounted on the fixation screw between the housing of the fan and the chassis of the machine. Assembling such a device requires first introducing the screw into the fan housing, then installing the elastic part, and finally fixing the unit to the chassis. These operations are complicated and hard to automate and tend to increase the cost of the product.

OBJECT AND SUMMARY OF THE INVENTION

It is accordingly the object of the invention to propose a fan fixation and muffling module that makes it possible to assure the fixation and reduction of the operating noise of the fan, while being easy and fast to assemble.

This object is attained in that the module includes a support housing in the form of a cube with cut-off corners, the upper and lower faces of which are provided with air circulation openings; the upper face includes means that interlock with the chassis of the machine, and the cut-off corners include openings enabling the introduction of the corners of a unit formed by the fan housing, which is surrounded on its periphery by a block of foam.

In another feature, the openings are trapezoidal, with the short base of the trapezoid close to the opening of the upper face.

In another feature, the opening of the upper face is larger in size than the fan housing, but smaller than the size of the set comprising the fan housing and foam block.

In another feature, the fan housing includes side flanks joined by a cylindrical portion in such a manner as to form a circular throat and bosses that are distributed regularly, preferably at the location of the flanks.

In another feature, the housing includes bosses on its inner flanks, for wedging the unit comprising the fan and foam block.

In another feature, the fan housing is solidly joined, via an electrical cable, to a printed circuit including a connection zone, the printed circuit being introduced into a front opening of the fan block unit for fixation on the lower face, at the rear of the housing, on elastic fixation dog points.

In another feature, the front face includes hooks that comprise the means for interlocking onto the chassis; the dimensions and position of the circuit are designed so that connection zone comes to face a connector mounted on the main board of the machine.

Further characteristics and advantages of the present invention will become more apparent from the ensuing detailed description, taken in conjunction with the drawings.

DESCRIPTION OF THE PREFERRED EMBODIMENT

Figure 1:
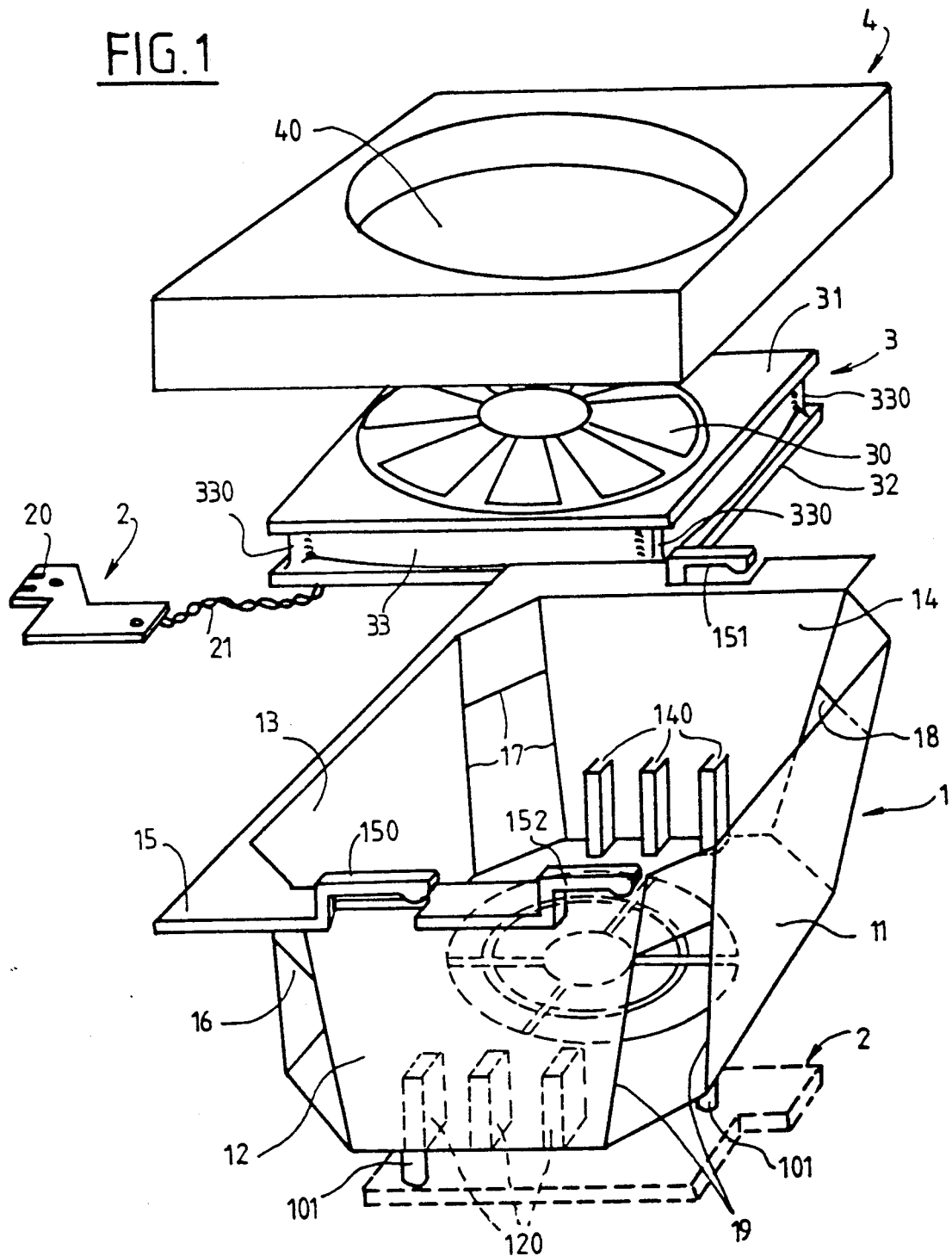
FIG. 1 is a perspective view of the fixation and muffling module according to the invention.
Figure 2:
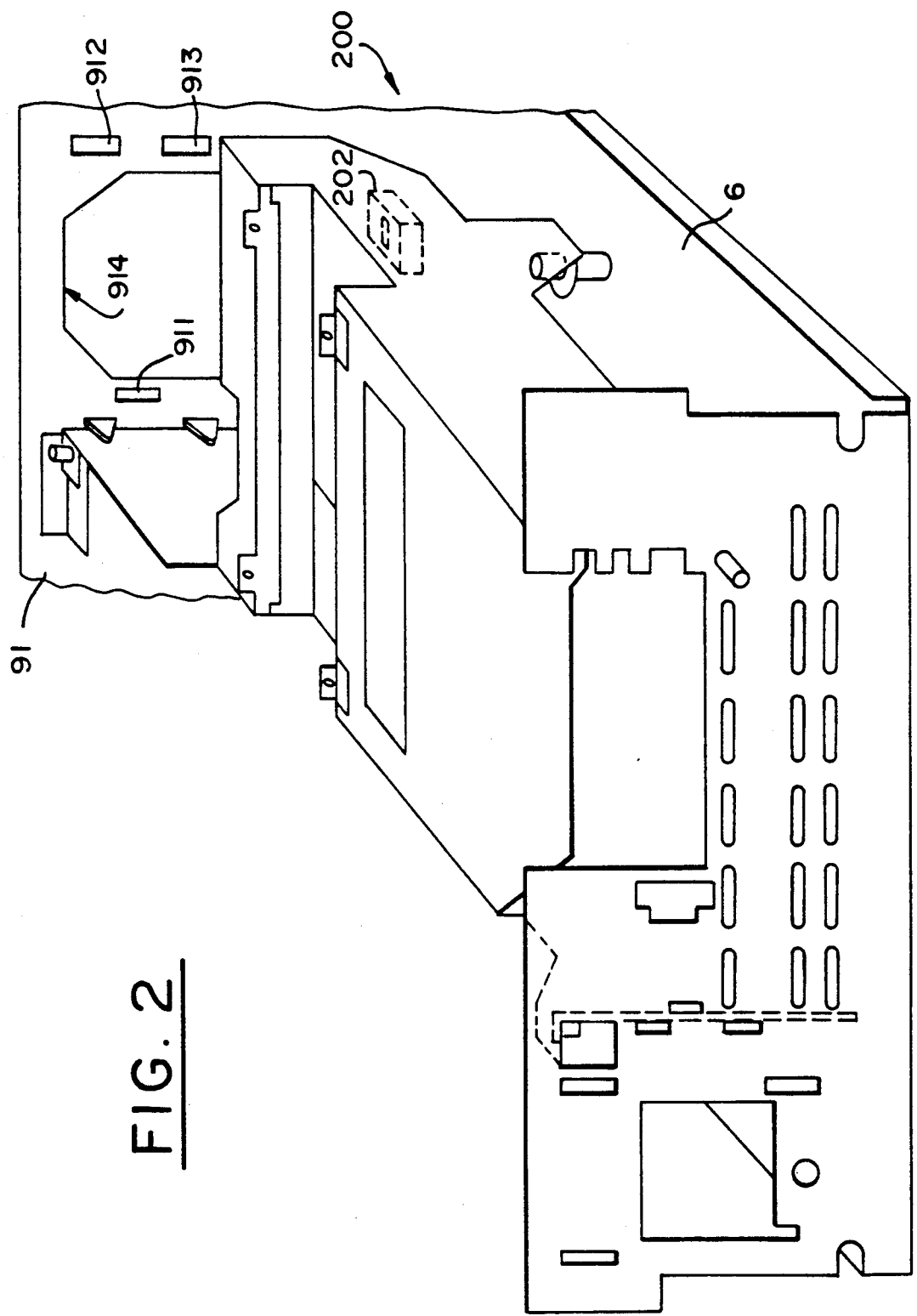
FIG. 2 is a perspective view of the chassis of the machine on which the module is mounted.
Figure 3:
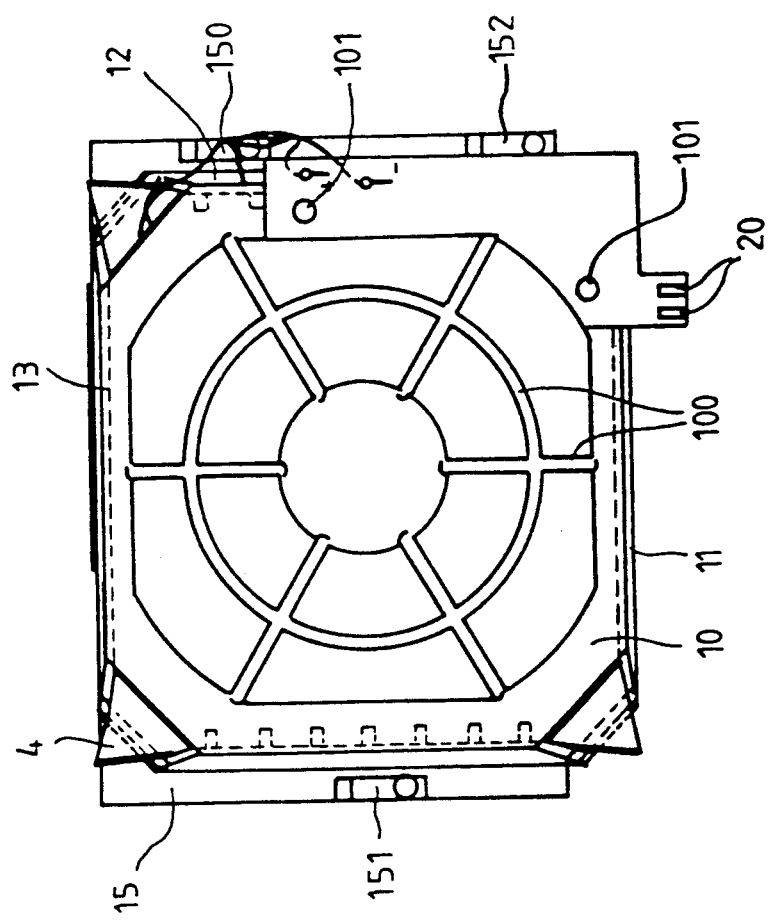
FIG. 3 is a view of the fixation module from the back.
Figure 4:
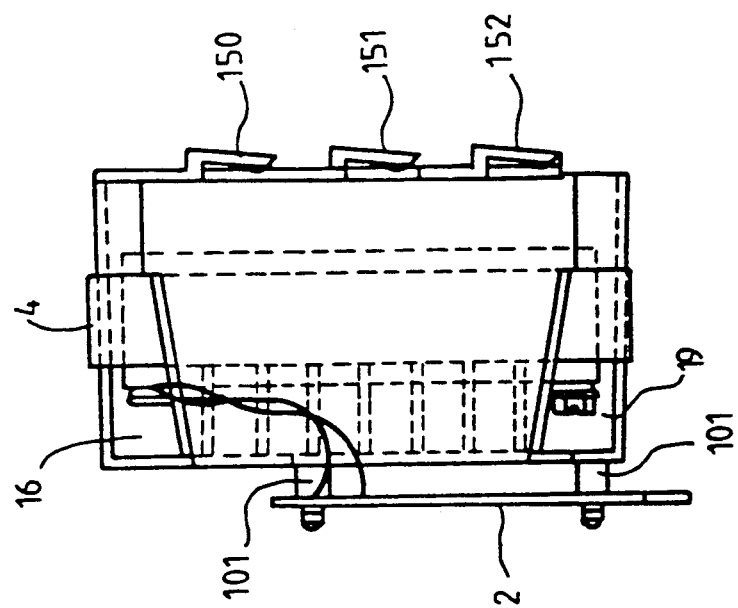
FIG. 4 is a view of the fixation module from the side.

The invention will be described with reference to FIGS. 1, 2, 3 and 4, in which it can be seen that the module comprises a housing 1 in the form of a parallelepiped with cut-off corners, the parallel faces 11, 13, 12, 14 of which are connected to one another by portions of trapezoidal surfaces provided with trapezoidal openings 16, 17, 18, 19, formed by cutting the corners obliquely as shown in FIG. 1. The trapezoidal openings have their short side oriented toward the upper face of the housing. The upper face 15 of the housing includes hooks 150, 151, 152 for interlocking of the housing assembly onto the chassis of the machine. The lower face 10, or bottom of the housing, is provided with openings defined by ribs 100, as can be seen in FIG. 3. The upper and lower faces 15, 10 are designed to permit easy circulation of an air flow parallel to the side faces 11, 12, 13, 14. The side faces 11, 12, 13, 14 may have a slight taper toward the lower face 10, so as to permit easier unmolding of the part when it is manufactured. Some side faces 12, 14 include bosses 120, 140 on their inner surface. Similarly, on its surface facing outward, the lower face 10 includes two dog points 101 that enable the fixation of a printed circuit 2, as will be seen hereinafter. This housing 1 is used for placement inside a fan housing 3, which includes a fan 30 surrounded by two side flanks 31, 32, the surfaces of which are disposed perpendicular to the axis of rotation of the fan; these two surfaces 31, 32 are joined to one another by a cylindrical portion 33, in such a manner as to form a throat having bosses 330 distributed regularly over its periphery. The fan motor is connected by a cable 21 to a printed circuit 2, which at one of its ends includes a connection zone 20. A foam block 4 can be mounted in the throat of the fan housing, and the central portion 40 of the foam block has been hollowed out so as to adapt to the periphery of the cylindrical portions 33. The bosses 330, which penetrate the foam block, make it possible to assure the solid attachment, in a manner fixed against relative rotation, of this foam block with respect to the corners of the fan housing. The assembly of the unit comprising the foam block 4 and fan housing 3 is effected by first sliding the printed circuit 2 through the opening 16, causing it to pass from the inside of the housing 1 toward the outside of it. Next, the foam block is introduced through the opening 16 by inclining the unit of the foam block and fan; then by compressing the foam block between the fan and the housing 1, the fan housing and foam block unit is made to rock, causing each of the corners of the foam block to penetrate the respective openings 17, 18, 19, successively. The bosses 140, 120 make it possible to avoid any tendency of the foam block to descend toward the bottom of the housing 1. The openings 16, 17, 18, 19, having a trapezoidal shape the dimensions of which are reduced toward the upper face of the housing, make it possible to assure wedging of the foam block 4, thus contributing to the fixation of the unit comprising the fan housing 3 and foam block.

The mounting operation is completed by mounting the printed circuit 2 on dog points 101 in the manner shown in dashed lines in FIG. 1. Once the assembly of the module has been completed, it is moved to face the opening 914 of the back face 91 of the chassis (200) of the machine; the interlocking pins 150, 151, 152 penetrate the openings 911, 912, 913 cut into the back face 91, thus assuring the fixation of the module. This fixation of the module also becomes complete when the connection zone 20 of the printed circuit penetrates a connector, shown schematically at 202, mounted in the proper position on the main board 6 of the machine.

Any modifications within the competence of one skilled in the art may be made without departing from the spirit and scope of the invention.

What is claimed is:

1. A module for fixation and muffling of a fan for a chassis of an electronic machine, characterized in that the module includes a support housing (1) in the form of a cube with cut-off corners, said support housing (1) comprising two pair of parallel faces (11, 12, 13, 14), each pair forming opposing sides of the cube, the sides of the cube being connected to each other by portions of trapezoidal surfaces disposed at each cut-off corner and upper (15) and lower (10) faces each having an air circulation opening, said upper face including means (150, 151, 152) for interlocking with the chassis of the machine, said trapezoidal surfaces including openings (16, 17, 18, 19) enabling the introduction of the corners of a fan housing (3) surrounded on its periphery by a foam block (4).

2. The module as defined by claim 1, characterized in that the openings (16, 17, 18, 19) in said trapezoidal surfaces are also trapezoidal, with the short base of the trapezoid being disposed toward the opening of the upper face (15).

3. The module as defined by claim 2, characterized in that the upper face air circulation opening is larger in size than the fan housing (3), but smaller than the size of the set comprising the fan housing (3) and the foam block (4).

4. The module as defined by claim 3, characterized in that the fan housing (3) includes side flanks (31, 32) joined by a cylindrical portion (33) in such a manner as to form a circular throat and bosses (330) said bosses being distributed regularly about the throat.

5. The module as defined in claim 4 wherein the bosses are disposed at the corners of the flanks (31, 32).

6. The module as defined by claim 3, characterized in that the support housing (1) includes, on the inner faces of one pair of the parallel faces of the housing (14, 12), bosses (120, 140) for wedging the unit comprising the fan (3) and foam block (4).

7. The module as defined by claim 4, characterized in that the support housing (1) includes, on the inner faces of one pair of the parallel faces of the housing (14, 12), bosses (120, 140) for wedging the unit comprising the fan (3) and foam block (4).

8. The module as defined by claim 4, characterized in that the fan housing (3) is connected, via an electrical cable (21), to a printed circuit (2) having a connection zone (20), the electrical cable (21) extending through one of said trapezoidal openings of the module and the printed circuit (2) being mounted on the lower face (10), at the rear of the housing (1), on elastic fixation dog points (101).

9. The module as defined by claim 5, characterized in that the fan housing (3) is connected, via an electrical cable (21), to a printed circuit (2) including a connection zone (20), the electrical cable (2) extending through one of said trapezoidal openings of the module and the printed circuit (21) being mounted on the lower face (10), at the rear of the housing (1), on elastic fixation dog points (101).

10. The module as defined by claim 6, characterized in that the fan housing (3) is connected, via an electrical cable (21), to a printed circuit (2) including a connection zone (20), the electrical cable (2) extending through one of said trapezoidal openings of the module and the printed circuit (21) being mounted on the lower face (10), at the rear of the housing (1), on elastic fixation dog points (101).

11. The module as defined by claim 7, characterized in that the fan housing (3) is connected, via an electrical cable (21), to a printed circuit (2) including a connection zone (20), the electrical cable (2) extending through one of said trapezoidal openings of the module and the printed circuit (21) being mounted on the lower face (10), at the rear of the housing (1), on elastic fixation dog points (101).

12. The module as defined by claim 8, characterized in that the interlocking means on the front face (15) comprises a plurality of hooks (150, 151, 152), and wherein the dimensions and position of the printed circuit (2) are designed so that the connection zone (20) comes to face a connector mounted on the main board (6) of the machine.

13. The module as defined by claim 9, characterized in that the interlocking means on the front face (15) comprises a plurality of hooks (150, 151, 152), and wherein the dimensions and position of the printed circuit (2) are designed so that the connection zone (20) comes to face a connector mounted on the main board (6) of the machine.

14. The module as defined by claim 10, characterized in that the interlocking means on the front face (15) comprises a plurality of hooks (150, 151, 152), and wherein the dimensions and position of the printed circuit (2) are designed so that the connection zone (20) comes to face a connector mounted on the main board (6) of the machine.

15. The module as defined by claim 11, characterized in that the interlocking means on the front face (15) comprises a plurality of hooks (150, 151, 152), and wherein the dimensions and position of the printed circuit (2) are designed so that the connection zone (20) comes to face a connector mounted on the main board (6) of the machine.

* * * * *

UNITED STATES PATENT AND TRADEMARK OFFICE
CERTIFICATE OF CORRECTION

PATENT NO. : 5,101,321

DATED : March 31, 1992

INVENTOR(S) : Rene Remise, et al

It is certified that error appears in the above-identified patent and that said Letters Patent is hereby corrected as shown below:

```
On the cover page, after the listing of inventors
insert:  --[73] Assignee:  BULL. S.A.  Paris France.--
```

Signed and Sealed this

Thirtieth Day of November, 1993

Attest:

BRUCE LEHMAN

*Attesting Officer*    *Commissioner of Patents and Trademarks*